(12) United States Patent
Hwang et al.

(10) Patent No.: US 11,183,462 B2
(45) Date of Patent: Nov. 23, 2021

(54) SUBSTRATE HAVING ELECTRONIC COMPONENT EMBEDDED THEREIN

(71) Applicant: SAMSUNG ELECTRO-MECHANICS CO., LTD., Suwon-si (KR)

(72) Inventors: Mi Sun Hwang, Suwon-si (KR); Dae Jung Byun, Suwon-si (KR); Chang Hwa Park, Suwon-si (KR); Sang Ho Jeong, Suwon-si (KR); Jun Hyeong Jang, Suwon-si (KR); Ki Ho Na, Suwon-si (KR); Je Sang Park, Suwon-si (KR); Yong Duk Lee, Suwon-si (KR); Yoo Rim Cha, Suwon-si (KR); Yeo Il Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/809,925

(22) Filed: Mar. 5, 2020

(65) Prior Publication Data
US 2021/0183784 A1 Jun. 17, 2021

(30) Foreign Application Priority Data
Dec. 16, 2019 (KR) .......................... 10-2019-0167952

(51) Int. Cl.
*H01L 23/538* (2006.01)
*H01L 23/00* (2006.01)

(52) U.S. Cl.
CPC ...... *H01L 23/5389* (2013.01); *H01L 23/5383* (2013.01); *H01L 23/5386* (2013.01);
(Continued)

(58) Field of Classification Search
CPC ............. H01L 23/5389; H01L 23/5383; H01L 23/5386; H01L 24/08; H01L 24/32;
(Continued)

(56) References Cited

U.S. PATENT DOCUMENTS 7,727,802 B2 * 6/2010 Sunohara ............... H05K 1/185
438/107
7,842,887 B2 * 11/2010 Sakamoto ............... H01L 24/19
174/260

(Continued)

FOREIGN PATENT DOCUMENTS

JP 2015-53350 A 3/2015
KR 10-1901712 B1 9/2018

*Primary Examiner* — Ida M Soward
(74) *Attorney, Agent, or Firm* — Morgan, Lewis & Bockius LLP

(57) ABSTRACT

A substrate having an electronic component embedded therein includes a core structure including a first insulating body and a plurality of core wiring layers disposed on or in the first insulating body, and having a cavity penetrating at least a portion of the first insulating body in a thickness direction of the substrate and including a stopper layer as a bottom surface of the cavity, and an electronic component disposed in the cavity and attached to the stopper layer, and a surface of the stopper layer connected to the electronic component has a composite including at least two among a metal material, an inorganic particle, a filler, and an insulating resin.

20 Claims, 8 Drawing Sheets

(52) U.S. Cl.
CPC .............. *H01L 24/08* (2013.01); *H01L 24/32* (2013.01); *H01L 24/23* (2013.01); *H01L 24/24* (2013.01); *H01L 24/25* (2013.01); *H01L 2224/08235* (2013.01); *H01L 2224/23* (2013.01); *H01L 2224/32225* (2013.01); *H01L 2924/15153* (2013.01); *H01L 2924/15155* (2013.01); *H01L 2924/15172* (2013.01); *H01L 2924/15331* (2013.01)

(58) Field of Classification Search
CPC ........... H01L 2224/24227; H01L 24/23; H01L 24/24; H01L 24/25; H01L 2224/23; H01L 2924/15153; H01L 2924/15155; H01L 2924/15172; H01L 2924/15331
See application file for complete search history.

(56) References Cited

U.S. PATENT DOCUMENTS

| | | | | |
|---|---|---|---|---|
| 9,373,610 | B2* | 6/2016 | Lin | H01L 24/73 |
| 9,907,157 | B2* | 2/2018 | Kim | H05K 1/0218 |
| 10,163,802 | B2* | 12/2018 | Lin | H01L 24/24 |
| 10,347,586 | B2* | 7/2019 | Kim | H01L 23/49816 |
| 10,453,788 | B2* | 10/2019 | Lee | H01L 23/13 |
| 10,504,825 | B2* | 12/2019 | Lee | H01L 24/13 |
| 10,504,836 | B2* | 12/2019 | Kuroyanagi | H01L 24/19 |
| 10,522,497 | B2* | 12/2019 | Lee | H01L 23/49822 |
| 10,685,916 | B2* | 6/2020 | Shin | H01L 24/73 |
| 10,707,168 | B2* | 7/2020 | Alur | H01L 21/4857 |
| 10,790,255 | B2* | 9/2020 | Kim | H01L 21/6836 |
| 10,804,254 | B2* | 10/2020 | Tsai | H01L 23/3128 |
| 10,861,814 | B2* | 12/2020 | Lee | H01L 21/56 |
| 10,930,586 | B2* | 2/2021 | Wu | H01L 23/49827 |
| 10,985,127 | B2* | 4/2021 | Lee | H01L 24/25 |
| 11,049,782 | B2* | 6/2021 | Lee | H01L 21/4857 |
| 2010/0101849 | A1* | 4/2010 | Sunohara | H05K 1/185 174/260 |
| 2011/0290540 | A1* | 12/2011 | Jung | H05K 3/4676 174/255 |
| 2017/0194300 | A1* | 7/2017 | Lin | H01L 21/6835 |
| 2017/0243803 | A1* | 8/2017 | Lin | H01L 23/49833 |
| 2018/0005949 | A1* | 1/2018 | Lin | H05K 3/46 |
| 2018/0374801 | A1* | 12/2018 | Jeng | H01L 21/0217 |
| 2019/0096841 | A1* | 3/2019 | Liu | H01L 23/5384 |
| 2019/0131226 | A1 | 5/2019 | Lee et al. | |
| 2019/0295972 | A1* | 9/2019 | Tsai | H01Q 1/2283 |
| 2020/0111732 | A1* | 4/2020 | Kanbe | H01L 21/4846 |
| 2020/0203303 | A1* | 6/2020 | Lin | H01L 23/5389 |

* cited by examiner

I-I'

US 11,183,462 B2

SUBSTRATE HAVING ELECTRONIC COMPONENT EMBEDDED THEREIN

CROSS-REFERENCE TO RELATED APPLICATION(S)

This application claims benefit of priority to Korean Patent Application No. 10-2019-0167952 filed on Dec. 16, 2019 in the Korean Intellectual Property Office, the disclosure of which is incorporated herein by reference in its entirety.

BACKGROUND

The present disclosure relates to a substrate having an electronic component embedded therein.

As a circuit has been designed to have high density and a reduced size and thickness, it has been necessary to improve various properties of a circuit. Accordingly, a technique of embedding an active component and/or a passive component in a printed circuit board (PCB) has been actively researched, and a technique for securing reliability in the above-described structure has been suggested. In a substrate having a component embedded therein, a die having a relatively low coefficient of thermal expansion (CTE) may be inserted into an organic composite material having a relatively high coefficient of thermal expansion, and there may be a difference in coefficients of thermal expansion such that various issues related to reliability may occur. For example, interfacial delamination may occur between different materials due to warpage of a substrate, and the interfacial delamination may also occur after a thermal cycle or a humidity test.

SUMMARY

An aspect of the present disclosure is to provide a substrate having an electronic component embedded therein having improved bonding reliability between different materials.

Another aspect of the present disclosure is to provide a substrate having an electronic component embedded therein which may be modulated in a form of a SiP and may have a reduced size.

Another aspect of the present disclosure is to form a composite including at least two among a metal material, an inorganic particle, a filler, and an insulating resin on an exposed surface of a stopper layer provided to form a cavity.

According to an aspect of the present disclosure, a substrate having an electronic component embedded therein includes a core structure including a first insulating body and a plurality of core wiring layers disposed on or in the first insulating body, and having a cavity penetrating at least a portion of the first insulating body in a thickness direction of the substrate and including a stopper layer as a bottom surface of the cavity, and an electronic component disposed in the cavity and attached to the stopper layer, and a surface of the stopper layer facing the electronic component has a composite including at least two among a metal material, an inorganic particle, a filler, and an insulating resin.

According to an aspect of the present disclosure, a substrate having an electronic component embedded therein includes a core structure including a first insulating body and a plurality of core wiring layers disposed on or in the first insulating body, and having a cavity penetrating at least a portion of the first insulating body in a thickness direction of the substrate and including a stopper layer as a bottom surface of the cavity, and an electronic component disposed in the cavity and attached to the stopper layer, the stopper layer has a first region in which a portion of a surface of the stopper layer is exposed from the first insulating body and a second region in which the other portion of the surface is covered by the first insulating body, and a material of the surface of the stopper layer disposed in the first region is different from a material of the surface of the stopper layer disposed in the second region.

According to an aspect of the present disclosure, a substrate includes a core structure including an insulating body and a plurality of core wiring layers disposed on or in the insulating body, and having a cavity penetrating at least a portion of the insulating body in a thickness direction of the substrate and including a stopper layer as a bottom surface of the cavity; an electronic component disposed in the cavity and on the stopper layer; and a built-up insulating layer covering at least a portion of each of the core structure and the electronic component and disposed in at least a portion of the cavity. A surface of the stopper layer facing the electronic component has a composite comprising one or more of silicon carbide (SiC) and alumina ($Al_2O_3$), and the built-up insulating layer is in contact with the composite.

Another aspect of the present disclosure is to introduce a modulated structure by disposing a surface-mount component on a substrate having an electronic component embedded therein.

For example, one or more surface-mount components may be mounted on a structure of a substrate having an electronic component embedded therein through electrical connector metals.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
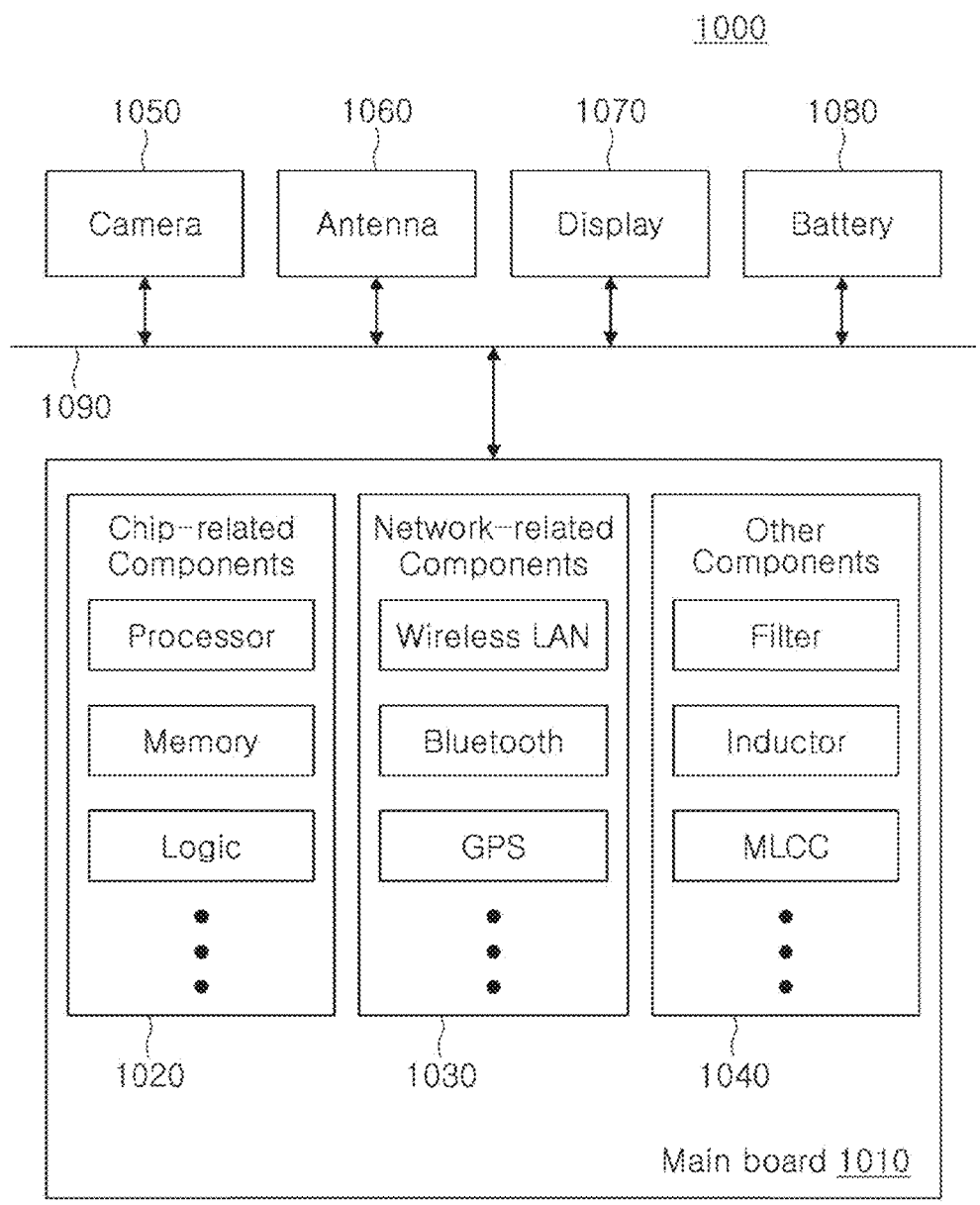
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
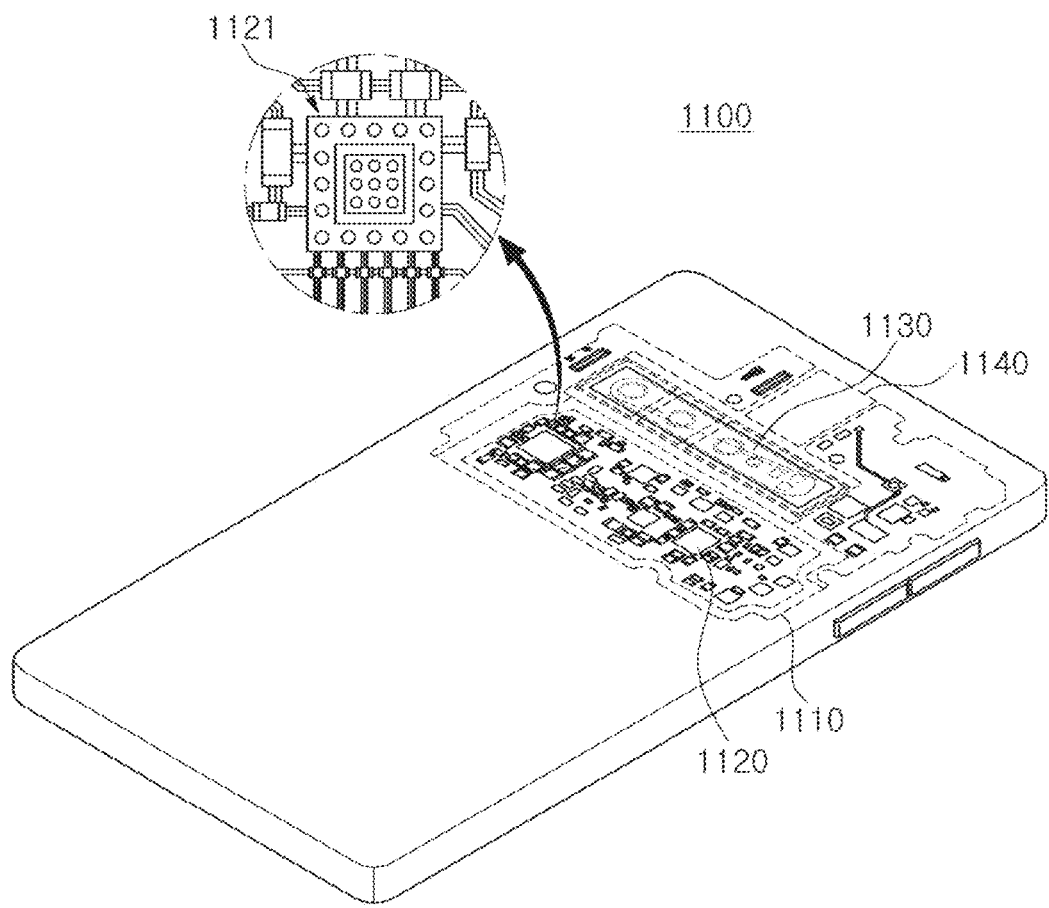
FIG. 2 is a perspective diagram illustrating an example of an electronic device.

FIG. 2 is a perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, a semiconductor package 1121, for example, but are not limited thereto. The electronic device is not necessarily limited to the smartphone 1100, but may be other electronic devices as described above.

Figure 3:
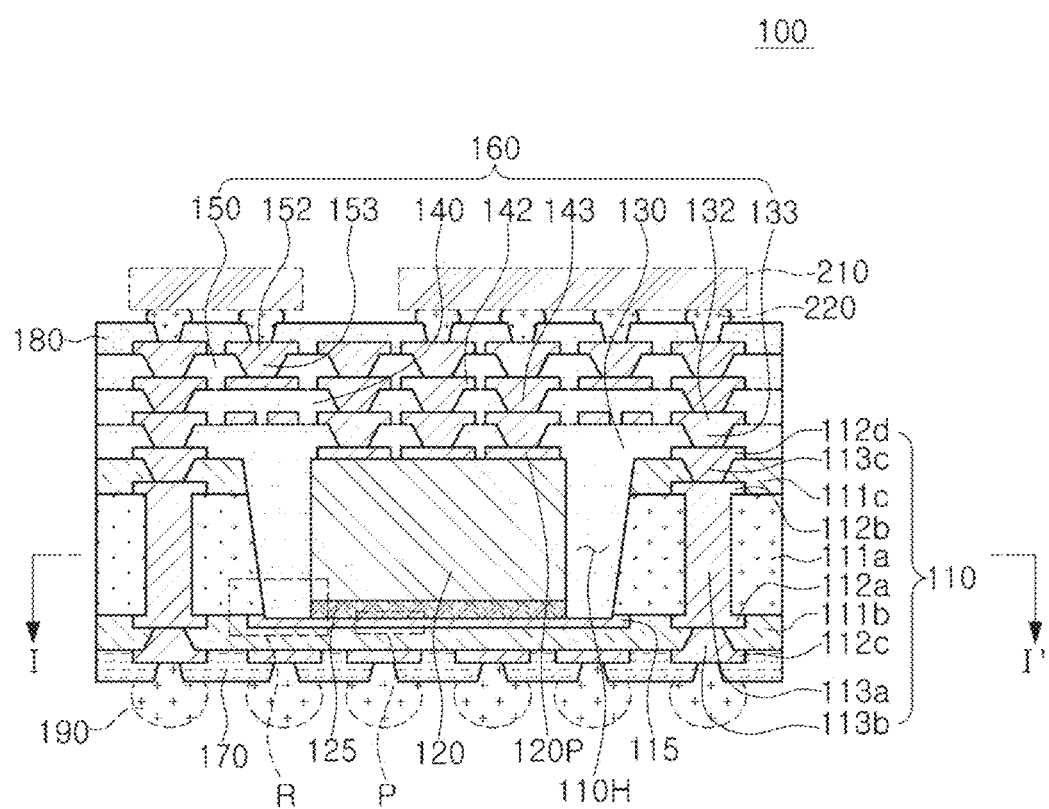
FIG. 3 is a cross-sectional diagram illustrating an example of a substrate having an electronic component embedded therein.

FIG. 3 is a cross-sectional diagram illustrating an example of a substrate having an electronic component embedded therein.

Figure 4:
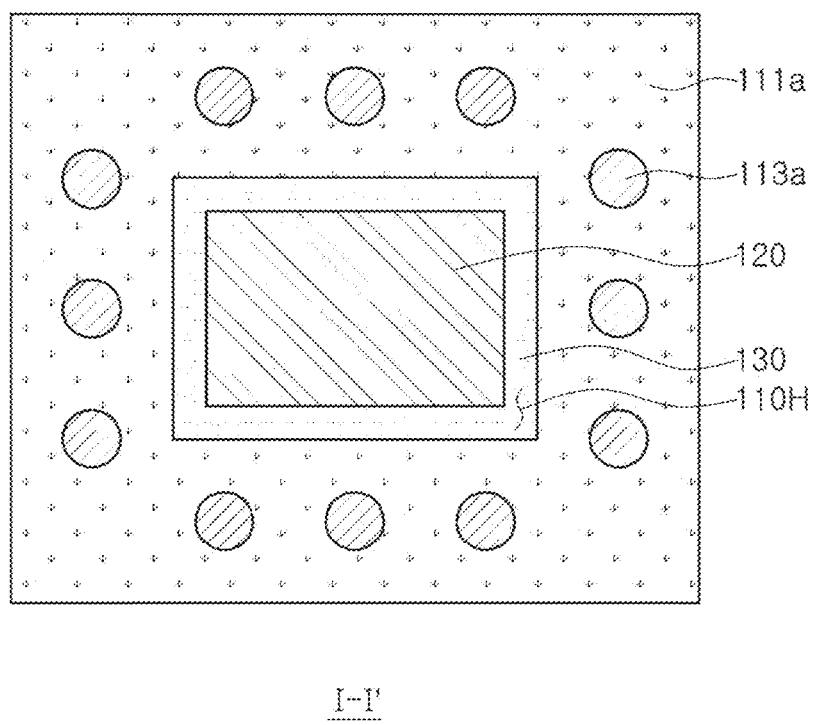
FIG. 4 is a cross-sectional plan diagram illustrating a substrate having the electronic component embedded therein illustrated in FIG. 3 taken long line I-I' in FIG. 3.

FIG. 4 is a cross-sectional plan diagram illustrating the substrate having the electronic component embedded therein illustrated in FIG. 3 taken long line I-I' in FIG. 3.

Figure 5:
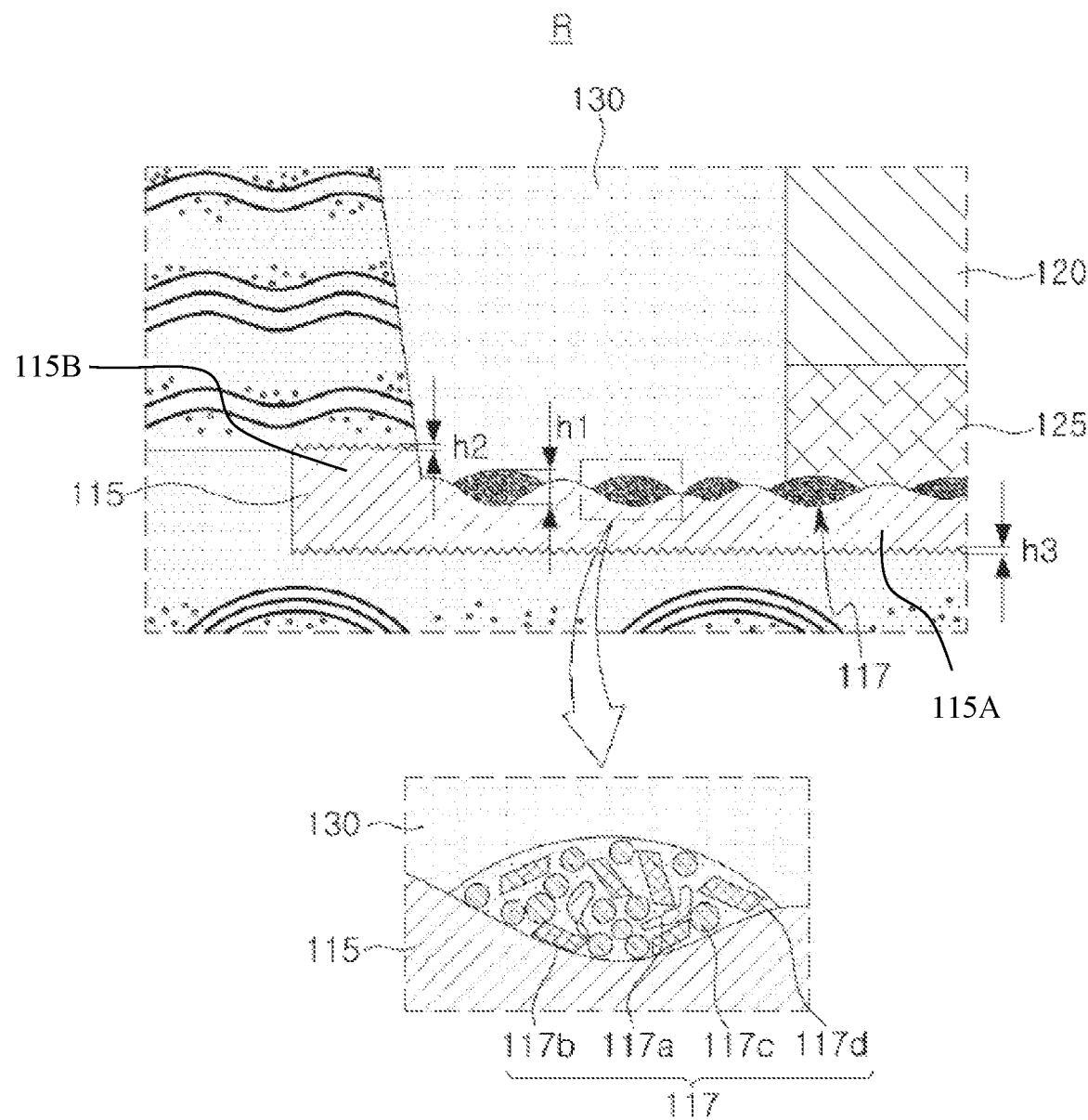
FIG. 5 is an enlarged cross-sectional diagram illustrating region R of the substrate having an electronic component embedded therein illustrated in FIG. 3.

FIG. 5 is an enlarged cross-sectional diagram illustrating region R of the substrate having an electronic component embedded therein illustrated in FIG. 3.

Figure 6:
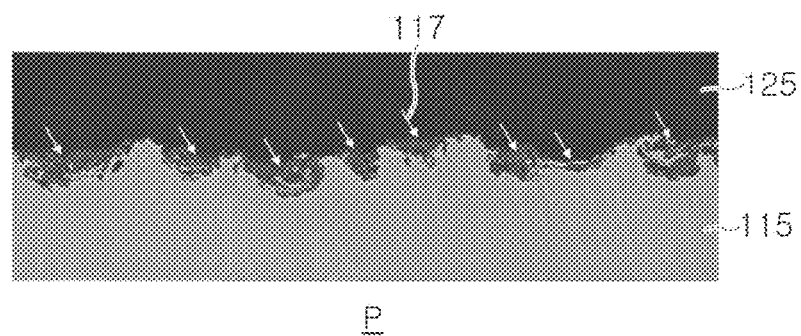
FIG. 6 is an enlarged image of a cross-sectional surface of region P of the substrate having an electronic component embedded therein illustrated in FIG. 3, obtained using an electron microscope.

FIG. 6 is an enlarged image of a cross-sectional surface of region P of the substrate having an electronic component embedded therein illustrated in FIG. 3, obtained using an electron microscope.

Referring to the diagrams, a substrate having an electronic component embedded therein 100 may include a core structure 110, an electronic component 120, a built-up structure 160, a first passivation layer 170, and a second passivation layer 180. The core structure 110 may have a cavity 110H penetrating portions 111a and 111c of first insulating bodies 111a, 111b, and 111c in a thickness direction. A stopper layer 115 may be disposed as a bottom surface of the cavity 110H. The electronic component 120 may be disposed in the cavity 110H and may be attached to the stopper layer 115. The stopper layer 115 may have a central region 115A in which a portion of an upper surface of the stopper layer 115 is exposed from the first insulating bodies 111a, 111b, and 111c by the cavity 110H, and an edge region 115B in which the other portion of the upper surface is covered by the first insulating bodies 111a, 111b, and 111c. An upper surface of the stopper layer 115 disposed in the central region 115A has one or more composites 117. For example, a plurality of the composites 117 may be disposed on the surface of the stopper layer 115.

Each of the composites 117 may include at least two materials of a metal material 117a, an inorganic particle 117b, a filler 117c, and an insulating resin 117d. For example, each of the composites 117 may include the metal material 117a and the inorganic particle 117b, may include the inorganic particle 117b and the insulating resin 117d, may include inorganic particle 117b, the filler 117c, and the insulating resin 117d, may include the metal material 117a, the inorganic particle 117b, the insulating resin 117d, or may include the metal material 117a, the inorganic particle 117b, the filler 117c, and the insulating resin 117d.

As described above, recently, a technique of embedding an active component and/or a passive component in a substrate has been required. As for a structure of a substrate having an electronic component embedded therein, warpage may be more easily controlled in a symmetrical structure than in an asymmetrical structure. However, to remove unnecessary layers and to secure a sufficient thickness of an electronic component, an asymmetrical structure may be required. To embed and bury an electronic component in a substrate having an asymmetrical structure, it may be necessary to form a cavity having blind form. To form such a cavity, a laser process or a blast process may be considered, and in this case, a stopper layer of a metal material may be required to adjust a process depth. After forming the cavity, an electronic component may be attached to the stopper layer using an adhesive, or the like. An exposed surface of the stopper layer after a laser process or a blast process may not have sufficient roughness as the surface is processed. Accordingly, adhesive force between different materials of an adhesive including resin and the stopper layer including a metal may decrease such that interfacial delamination may occur between the stopper layer and the adhesive. For example, the interfacial delamination may occur due to warpage of a substrate, and the interfacial delamination may also occur after a thermal cycle or a humidity test. Such interfacial delamination may cause a reliability issue.

In the substrate having an electronic component embedded therein 100, the composite 117 may be disposed in the central region 115A, of the upper surface of the stopper layer 115 exposed by the cavity 110H, the stopper layer 115 providing the bottom surface for forming the cavity 110H. The composite 117 may include the metal material 117a, the inorganic particle 117b, and/or the filler 117c. Accordingly, the composite 117 may have improved mechanical strength and thermal stability, may improve heat dissipation properties, and may have an anchoring effect. Also, the composite 117 may include an insulating resin 117d such that the composite 117 including the metal material 117a, the inorganic particle 117b, and/or the filler 117c may be easily formed. Thus, adhesive force between different materials of the stopper layer 115 and an adhesive 125 may improve through the composite 117, and reliability of a thermal cycle and a humidity test may improve.

On an upper surface of the stopper layer 115, a material of the central region 115A may be different from a material of the edge region 115B. For example, the composite 117 may only be formed on the upper surface disposed in the central region 115A of the stopper layer 115 which may be exposed by the cavity 110H, and may not be formed in the edge region 115B which may be covered by a first core insulating layer 111a. Accordingly, the central region 115A of the upper surface of the stopper layer 115, exposed by the cavity 110H, may have the composite 117 including the metal material 117a, the inorganic particle 117b, and/or the filler 117c, whereas the edge region 115B, covered by the first insulating body 111a, may only include a metal material. As described above the composite 117 may be selectively introduced, introduced only in a region in which adhesive force with the adhesive 125 is degraded.

The upper surface of the stopper layer 115 may have an embossed surface in the central region 115A, and may have a fine roughness surface in the edge region 115B. An average difference h1 in heights of serrations of the embossed surface in the central region 115A may be greater than an average difference h2 in heights of serrations of the fine roughness surface in the edge region 115B. In the central region 115A, adhesive force of the upper surface of the stopper layer 115 with the adhesive 125 may easily improve through the embossed surface and the composite 117, and in the edge region 115B, adhesive force with the first insulating bodies 111a, 111b, and 111c may easily improve through the fine roughness. Similarly, a lower surface of the stopper layer 115 may have a fine roughness surface. Similarly to the fine roughness surface in the edge region 115B of the upper surface of the stopper layer 115, an average difference h3 in heights of serrations of the lower surface of the stopper layer 115, a fine roughness surface, may be less than the average difference h1 in heights of the serrations of the embossed surface. Accordingly, adhesive force with the first insulating bodies 111a, 111b, and 111c on a lower side of the stopper layer 115 may easily improve.

A thickness of the central region 115A of the stopper layer 115 may be less than a thickness of the edge region 115B. For example, as the central region 115A of the stopper layer 115 may be partially removed in a blast process, or the like, for forming the cavity 110H, the regions may have the above-described thicknesses.

In the description below, the elements included in the substrate having an electronic component embedded therein 100 will be described in greater detail with reference to the drawings.

The core structure 110 may include a first core insulating layer 111a, a first core wiring layer 112a and the stopper layer 115 disposed on a lower surface of the first core insulating layer 111a, a second core wiring layer 112b disposed on an upper surface of the first core insulating layer 111a, a second core insulating layer 111b disposed on the lower surface of the first core insulating layer 111a and covering at least a portion of each of the first core wiring layer 112a and the stopper layer 115, a third core wiring layer 112c disposed on a lower surface of the second core insulating layer 111b, a third core insulating layer 111c disposed on the upper surface of the first core insulating layer 111a and covering at least a portion of the second core wiring layer 112b, and a fourth core wiring layer 112d disposed on an upper surface of the third core insulating layer 111c. The core structure 110 may further include a first core via layer 113a penetrating the first core insulating layer 111a and connecting the first and second core wiring layers 112a and 112b to each other, a second core via layer 113b penetrating the second core insulating layer 111b and connecting the first and third core wiring layers 112a and 112c to each other, and a third core via layer 113a penetrating the third core insulating layer 111c and connecting the second and fourth core wiring layers 112b and 112d to each other.

The core structure 110 may improve stiffness of the substrate having an electronic component embedded therein 100 depending on a specific material of the core structure 110, and may secure uniformity of a thickness of a first built-up insulating layer 130. The core structure 110 may include the first to fourth core wiring layers 112a, 112b, 112c, and 112d and the first to third core via layers 113a, 113b, and 113c such that various circuits may be designed, and an upper and lower electrical connection path may be provided. Also, the core structure 110 may include the third core wiring layer 112c disposed on a side lower than a back surface of the electronic component 120 such that a backside wiring layer may be easily provided. The core structure 110 may include a greater number of layers than the number of layers illustrated in the diagram. The number of the core wiring layers 112a, 112b, 112c, and 112d of the core structure 110 may be greater than the number of built-up wiring layers 132, 142, and 152 of a built-up structure 160.

The core structure 110 may have the cavity 110H. The stopper layer 115 may be disposed as a bottom surface of the cavity 110H. The cavity 110H may have blind form and may penetrate the first core insulating layer 111a and the third core insulating layer 111c and may not penetrate the second core insulating layer 111b. The cavity 110H may have a tapered profile in which a width of a cross-sectional surface of the cavity 110H decreases from an upper side to a lower side, but an example embodiment thereof is not limited thereto.

As a material of the first core insulating layer 111a, an insulating material may be used. As the insulating material, an insulating material of a copper clad laminate (CCL) may be used. As a material of the second and third core insulating layers 111b and 111c, an insulating material may also be used, and as the insulating material, an insulating material of a resin coated copper (RCC) may be used. However, an example embodiment thereof is not limited thereto. As a material of each of the first to third core insulating layers 111a, 111b, and 111c, a thermosetting resin such as an epoxy resin, a thermoplastic resin such as a polyimide resin, a resin impregnated in a core such as glass fiber, or the like, together with a filler, such as prepreg, or the like, may be used, for example. When a material having high stiffness, such as prepreg including glass fiber, or the like, is used, warpage may be effectively controlled. The second and third core insulating layers 111b and 111c may include the same type of material. A thickness of the first core insulating layer 111a may be greater than a thickness of each of the second and third core insulating layers 111b and 111c.

The first to fourth core wiring layers 112a, 112b, 112c, and 112d may include a metal material such as copper (Cu), aluminum (Al), silver (Ag), tin (Sn), gold (Au), nickel (Ni), lead (Pb), titanium (Ti), or alloys thereof. The first to fourth core wiring layers 112a, 112b, 112c, and 112d may perform various functions depending on a design of each of the respective layers. For example, each of the first to fourth core wiring layers 112a, 112b, 112c, and 112d may a ground (GND) pattern, a power (PWR) pattern, a signal (S) pattern, and the like. The signal (S) pattern may include various signals other than a ground (GND) pattern, a power (PWR) pattern, and the like, a data signal, and the like, for example. Each of the patterns may have a line shape, a plane shape, or a pad shape. The first to fourth core wiring layers 112a, 112b, 112c, and 112d may be formed through a process such as an additive process (AP), a semi-AP (SAP) process, a modified SAP (MSAP) process, a tenting (TT) process, or the like, and accordingly, each of the first to fourth core wiring layers 112a, 112b, 112c, and 112d may include a seed layer, which is an electroless plating layer, and an electrolytic plating layer formed based on the seed layer. Each of the first to fourth core wiring layers 112a, 112b, 112c, and 112d may include copper foil as a lowermost layer. The first and second core wiring layers 112a and 112b may be formed based on a CCL, and may thus have copper foil as a lowermost layer.

The first to third core via layers 113a, 113b, and 113c may penetrate the first to third core insulating layers 111a, 111b, and 111c, respectively, and may connect the first to fourth core wiring layers 112a, 112b, 112c, and 112d to each other upwardly and downwardly. The first to third core via layers 113a, 113b, and 113c may include a metal material such as copper (Cu), aluminum (Al), silver (Ag), tin (Sn), gold (Au), nickel (Ni), lead (Pb), titanium (Ti), or alloys thereof. Each of the first to third core via layers 113a, 113b, and 113c may include a via used for a signal, a via used for ground, a via used for power, and the like, depending on a design of each of the respective layers. A connection via of each of the first to third core via layers 113a, 113b, and 113c may be entirely filled with a metal material, or a metal material may be formed along a wall of a via hole. The first core via layer 113a may have an hour-glass shape or a cylindrical shape. Each of the second and third core via layers 113b and 113c may have a profile tapered in opposite directions with the first core via layer 113a interposed therebetween. The first to third core via layers 113a, 113b, and 113c may be formed by an AP, a SAP, a MSAP, a TT, or the like, and accordingly, the first to third core via layers 113a, 113b, and 113c may include a seed layer, which is an electroless plating layer, and an electrolytic plating layer formed based on the seed layer. The first core via layer 113a may be formed based on a CCL, and may have a copper foil layer as a lowermost layer. A connection via of the first core via layer 113a may be integrated with pad patterns of the first and second core wiring layers 112a and 112b without a boundary. Connection vias of the second and third core via layers 113b and 113c may be integrated with pad patterns of the third and fourth core wiring layers 112c and 112d without a boundary.

The stopper layer 115 may be disposed on a lower surface of the first core insulating layer 111a, and may be covered by the second core insulating layer 111b. The stopper layer 115 may be also be formed by the same plating process for forming the first core wiring layer 112a, an AP, a SAP, a MSAP, a TT, or the like, for example, and may thus have a seed layer, which is an electroless plating layer, and an electrolytic plating layer formed based on the seed layer. The stopper layer 115 may include copper foil as a lowermost layer. The stopper layer 115 may be formed simultaneously with the first core wiring layer 112a through the same plating process. Accordingly, the stopper layer 115 may be disposed on a level the same as a level of the first core wiring layer 112a, and may include the same metal material, such as copper (Cu), aluminum (Al), silver (Ag), tin (Sn), gold (Au), nickel (Ni), lead (Pb), titanium (Ti), or alloys thereof, for example. The stopper layer 115 may have a plane shape. For example, the stopper layer 115 may have a rectangular shape or a square shape in which a central region is exposed on a plane and an edge region is buried, but an example embodiment thereof is not limited thereto.

A plurality of the composites 117 may be disposed on the surface of the stopper layer 115 exposed by the cavity 110H. The composite 117 may include the metal material 117a, the inorganic particle 117b, the filler 117c, and/or the insulating resin 117d. For example, each of the composites 117 may include all the above-mentioned materials. The metal material 117a may be the same as a material of the surface of the stopper layer 115, and may include copper (Cu), aluminum (Al), silver (Ag), tin (Sn), gold (Au), nickel (Ni), lead (Pb), titanium (Ti), or alloys thereof, for example. The inorganic particle 117b may include a grinding material, and the grinding material may be configured as a grinding material used in a sandblast process, such as a grinding material including silicon carbide (SiC) and/or alumina ($Al_2O_3$), for example. The filler 117c and the insulating resin 117d may be the same as a material included in at least a portion of the first insulating bodies 111a, 111b, and 111c, a material such as prepreg, for example. As an example, although not limited thereto, the filler 117c may be an inorganic filler and/or an organic filler, and the insulating resin 117d may be a thermoplastic resin and/or thermosetting region. The inorganic particle 117b may have an almost angular shape, whereas the filler 117c may have an almost circular shape. For example, the inorganic particle 117b and the filler 117c may be distinct from each other using an electron microscope.

The inorganic filler may be configured as one or more types of materials selected from among natural silica, fused silica, amorphous silica, hollow silica, aluminum hydroxide, boehmite, magnesium hydroxide, molybdenum oxide, zinc molybdate, zinc borate, zincstannate, aluminum borate, potassium titanate, magnesium sulfate, silicon carbide, zinc oxide, silicon nitride, silicon oxide, aluminum titanate, barium titanate, barium strontium titanate, aluminum oxide, alumina, clay, kaolin, talc, calcined clay, calcined kaolin, calcined talc, mica, short glass fiber, and a mixture thereof. The organic filler may be configured as one or more types of materials selected from among epoxy resin powder, melamine resin powder, urea resin powder, benzoguanamine resin powder, styrene resin power, and mixtures thereof. However, example embodiments thereof are not limited thereto.

The electronic component 120 may be disposed in the cavity 110H. A back surface of the electronic component 120 may be attached to the stopper layer 115 through a generally used adhesive 125 including an adhesive resin such as an epoxy resin, such as a die attach film (DAF). The electronic component 120 may be may be configured as an IC in which several hundred to several million or more devices are integrated in a single chip. For example, the electronic component 120 may be implemented by a processor chip such as a central processing unit (CPU), a graphics processor (GPU), a field programmable gate array (FPGA), an application processor (AP), a digital signal processor, a cryptographic processor, a microprocessor, a microcontroller, and the like, an application processor (AP), for example, but an example embodiment thereof is not limited thereto. The electronic component 120 may also be implemented by a memory such as a volatile memory (e.g., a DRAM), a non-volatile memory (e.g., a ROM and a flash memory), or the like, or a logic such as an application-specific IC (ASIC), or the like. The electronic component 120 may also be configured as a chip-type passive component.

The electronic component 120 may be formed based on an active wafer. As a base material of a body of the electronic component 120, silicon (Si), germanium (Ge), gallium arsenide (GaAs), or the like, may be used. Various circuits may be disposed in the body. A connection pad 120P may be disposed on an active surface of the body. The connection pad 120P may be configured to electrically connect the electronic component 120 to the other elements, and as a material of the connection pad 120P of the electronic component 120, a conductive material such as copper (Cu), aluminum (Al), or the like, may be used. A passivation film for covering at least a portion of the connection pad 120P and exposing at least a portion of the connection pad 120P may be disposed on an active surface of the body. The passivation film may be configured as an oxide film or a nitride film, or may be configured as a dual layer including an oxide film and a nitride film. An insulating film, and the like, may further be disposed in a desired position. The electronic component 120 may be configured as a bare die, but an example embodiment thereof is not limited thereto. The electronic component 120 may also be configured as a packaged die.

The built-up structure 160 may include a first built-up insulating layer 130 covering at least a portion of each of the core structure 110 and the electronic component 120 and filling at least a portion of the cavity 110H, a first built-up wiring layer 132 disposed on the first built-up insulating layer 130, a second built-up insulating layer 140 disposed on the first built-up insulating layer 130 and covering at least a portion of the first built-up wiring layer 132, a second built-up wiring layer 142 disposed on the second built-up insulating layer 140, a third built-up insulating layer 150 disposed on the second built-up insulating layer 140 and covering at least a portion of the second built-up wiring layer 142, and a third built-up wiring layer 152 disposed on the third built-up insulating layer 150. The built-up structure 160 may include a first built-up via layer 133 penetrating the first built-up insulating layer 130 and connecting the first built-up wiring layer 132 to a connection pad 120P and a fourth core wiring layer 112d, a second built-up via layer 143 penetrating the second built-up insulating layer 140 and connecting the first and second built-up wiring layers 132 and 142 to each other, and a third built-up via layer 153 penetrating the third built-up insulating layer 150 and connecting the second and third built-up wiring layers 142 and 152 to each other.

By including the built-up structure 160, a greater number of wirings may be designed in an upward direction. As the built-up structure 160 includes the first to third built-up wiring layers 132, 142, and 152 and the first to third built-up via layers 133, 143, and 153, various circuits may be designed, and an upper and lower electrical connection path may be provided. The built-up structure 160 may include a number of layers greater than the example illustrated in the diagram. However, an example embodiment thereof is not limited thereto, and the built-up structure 160 may include a number of layers less than the example illustrated in the diagram.

The first to third built-up insulating layers 130, 140, and 150 may be laminated in order on the core structure 110 and the electronic component 120. The first built-up insulating layer 130 may cover at least a portion of each of the core structure 110 and the electronic component 120, and may also fill at least a portion of the cavity 110H. A material of the first to third built-up insulating layers 130, 140, and 150 may not be limited to any particular material. For example, an insulating material may be used, and as the insulating material, a thermosetting resin such as an epoxy resin, a thermoplastic resin such as a polyimide resin, or a resin formed by mixing the above-mentioned resins with a filler, such as an Ajinomoto build-up film (ABF), for example, may be used. The first to third built-up insulating layers 130, 140, and 150 may include the same type of material. The first to third built-up insulating layers 130, 140, and 150 may be integrated with each other after a curing process such that a boundary therebetween may not be distinct.

The first to third built-up wiring layers 132, 142, and 152 may include a metal material such as copper (Cu), aluminum (Al), silver (Ag), tin (Sn), gold (Au), nickel (Ni), lead (Pb), titanium (Ti), or alloys thereof. The first to third built-up wiring layers 132, 142, and 152 may perform various functions in example embodiments. For example, each of the first to third built-up wiring layers 132, 142, and 152 may include a ground (GND) pattern, a power (PWR) pattern, a signal (S) pattern, and the like. The signal (S) pattern may include various signals other than a ground (GND) pattern, a power (PWR) pattern, and the like, a data signal, and the like, for example. Each pattern may have a line shape, a plane shape, or a pad shape. The first to third built-up wiring layers 132, 142, and 152 may also be formed by a plating process such as an AP, a SAP, a MSAP, a TT, or the like, and may include a seed layer, which is an electroless plating layer, and an electrolytic plating layer formed based on the seed layer. Each of the first to third built-up wiring layers 132, 142, and 152 may include copper foil as a lowermost layer.

The first to third built-up via layers 133, 143, and 153 may penetrate the first to third built-up insulating layers 130, 140, and 150, respectively. The first built-up via layer 133 may connect the first built-up wiring layer 132 to the connection pad 120P of the electronic component 120, and to the fourth core wiring layer 112d. The second and third built-up via layers 143 and 153 may connect the first to third built-up wiring layers 132, 142, and 152 to each other upwardly and downwardly. The first to third built-up via layers 133, 143, and 153 may also include a metal material such as copper (Cu), aluminum (Al), silver (Ag), tin (Sn), gold (Au), nickel (Ni), lead (Pb), titanium (Ti), or alloys thereof. The first to third built-up via layers 133, 143, and 153 may also include a via used for a signal, a via used for ground, a via used for power, and the like, depending on a design of each of the respective layers. Each of the first to third built-up via layers 133, 143, and 153 may be entirely filled with a metal material, or a metal material may be formed along a wall of a via hole. The first to third built-up via layers 133, 143, and 153 may have profiles tapered in the same direction. For example, on a cross-sectional surface of each of the first to third built-up via layers 133, 143, and 153, a width of an upper side may be greater than a width of a lower side. The first to third built-up via layers 133, 143, and 153 may be formed by a plating process such as an AP, a SAP, a MSAP, a TT, or the like, and may include a seed layer, which is an electroless plating layer, and an electrolytic plating layer formed based on the seed layer. Connection vias of the first to third built-up via layers 133, 143, and 153 may be integrated with pad patterns of the first to third built-up wiring layers 132, 142, and 152, respectively, without a boundary therebetween.

The first passivation layer 170 may protect the third core wiring layer 112c from external physical and chemical damages. The first passivation layer 170 may be disposed on a lower surface of the second core insulating layer 111b and may cover at least a portion of the third core wiring layer 112c, and may have a plurality of first openings for exposing at least a portion of the third core wiring layer 112c. A material of the first passivation layer 170 is not limited to any particular material. For example, an insulating material may be used, and as the insulating material, a thermosetting resin such as an epoxy resin, a thermoplastic resin such as a polyimide resin, or a resin formed by mixing the above-mentioned resins with a filler, such as an ABF, for example, may be used. However, an example embodiment thereof is not limited thereto, and a photosensitive insulating material, such as a solder resist, may be used.

The second passivation layer 180 may protect the third built-up wiring layer 152 from external physical and chemical damages. The second passivation layer 180 may be disposed on an upper surface of the third built-up insulating layer 150 and may cover at least a portion of the third built-up wiring layer 152, and may have a plurality of second openings for exposing at least a portion of the third built-up wiring layer 152. A material of the second passivation layer 180 is not limited to any particular material. For example, an insulating material may be used, and as the insulating material, the above-mentioned ABF or SR may be used. If desired, the second passivation layer 180 may include a material different from a material of the first passivation layer 170, and may have a coefficient of thermal expansion (CTE) lower than that of the first passivation layer 170, for example. Accordingly, a deviation in coefficient of thermal expansion between an upper portion and a lower portion of the substrate may be resolved.

A first electrical connector metal 190 may be disposed in each of the first openings of the first passivation layer 170. The first electrical connector metal 190 may be connected to the exposed third core wiring layer 112c. The first electrical connector metal 190 may physically and/or electrically connect the substrate having an electronic component embedded therein 100 to an external entity. For example, the substrate having an electronic component embedded therein 100 may be mounted on a mainboard or the other ball grid array (BGA) substrate of an electronic device through the first electrical connector metal 190. The first electrical connector metal 190 may be formed of tin (Sn), or an alloy including tin (Sn), such as a solder, for example, but an example embodiment thereof is not limited thereto. The first electrical connector metal 190 may be configured as a land, a ball, a pin, or the like. The first electrical connector metal 190 may include multiple layers, or a single layer. When the first electrical connector metal 190 includes multiple layers, the first electrical connector metal 190 may include copper pillar or solder, and when the first electrical connector metal 190 includes a single layer, the first electrical connector metal 190 may include tin-silver solder or copper. However, an example embodiment thereof is not limited thereto. The number of the first electrical connector metal 190, a gap between the first electrical connector metals 190, and an arrangement form of the first electrical connector metal 190 may not be limited to any particular examples, and may be varied in example embodiments. If desired, an under-bump metal (UBM) may be disposed in each of the plurality of first openings, and the first electrical connector metals 190 may be connected to the under-bump metals, respectively.

A surface-mount component 210 may be disposed on the second passivation layer 180. The surface-mount component 210 may be surface-mounted on the second passivation layer 180 through a second electrical connector metal 220. The surface-mount component 210 may be configured as an active component and/or a passive component. As the active component, the IC described in the description of the electronic component 120 may be used, for example. As the passive component, a chip-type capacitor such as a multilayer ceramic capacitor (MLCC), a chip-type inductor such as a power inductor (PI), or the like, may be used, for example. The second electrical connector metal 220 may include tin (Sn) or an alloy including tin (Sn), such as a solder, for example. If desired, a molding material covering the surface-mount component 210 may be disposed on the second passivation layer 180. The molding material may be an epoxy molding compound (EMC), but an example embodiment thereof is not limited thereto. When the surface-mount component 210 is disposed, the substrate having an electronic component embedded therein 100 may be used as an SiP.

The substrate having an electronic component embedded therein 100 may include the plurality of cavities 110H, and the stopper layer 115 may be disposed on each of the cavities 110H. In each of the cavities 110H, the same or different electronic components may be disposed.

Figure 7:
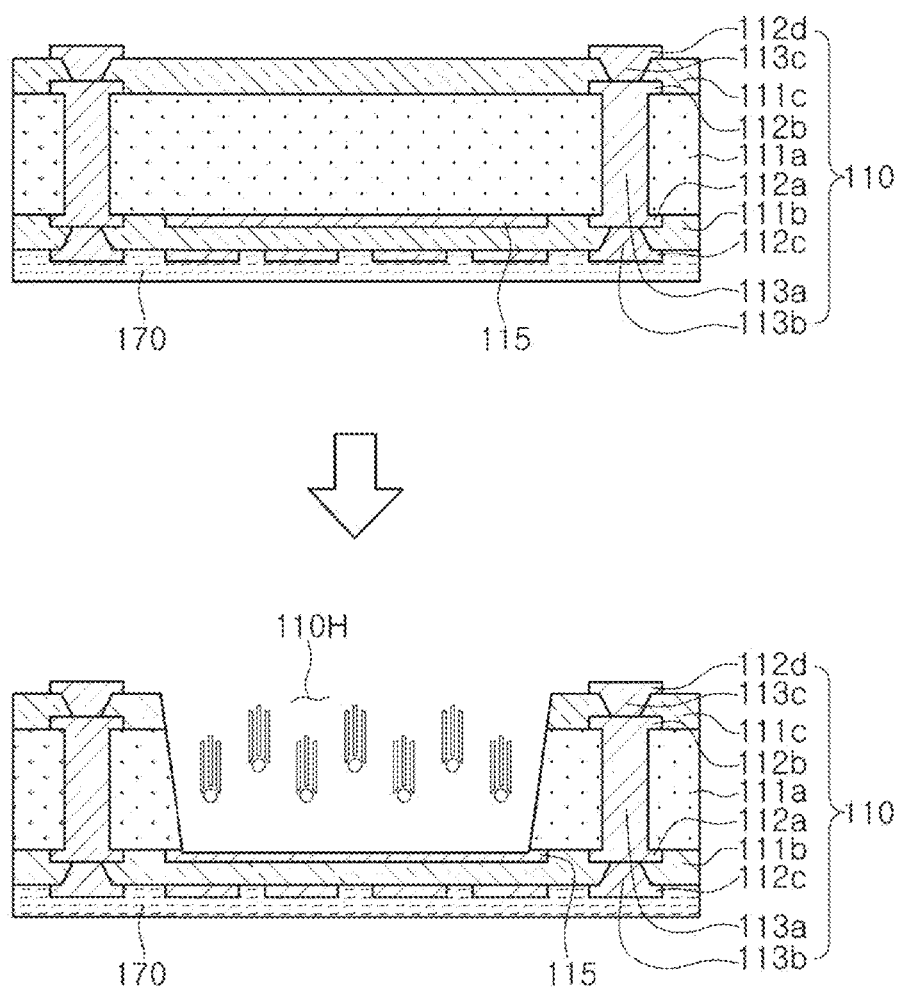
FIGS. 7 and 8 are diagrams illustrating processes of manufacturing the substrate having an electronic component embedded therein illustrated in FIG. 3.
Figure 8:
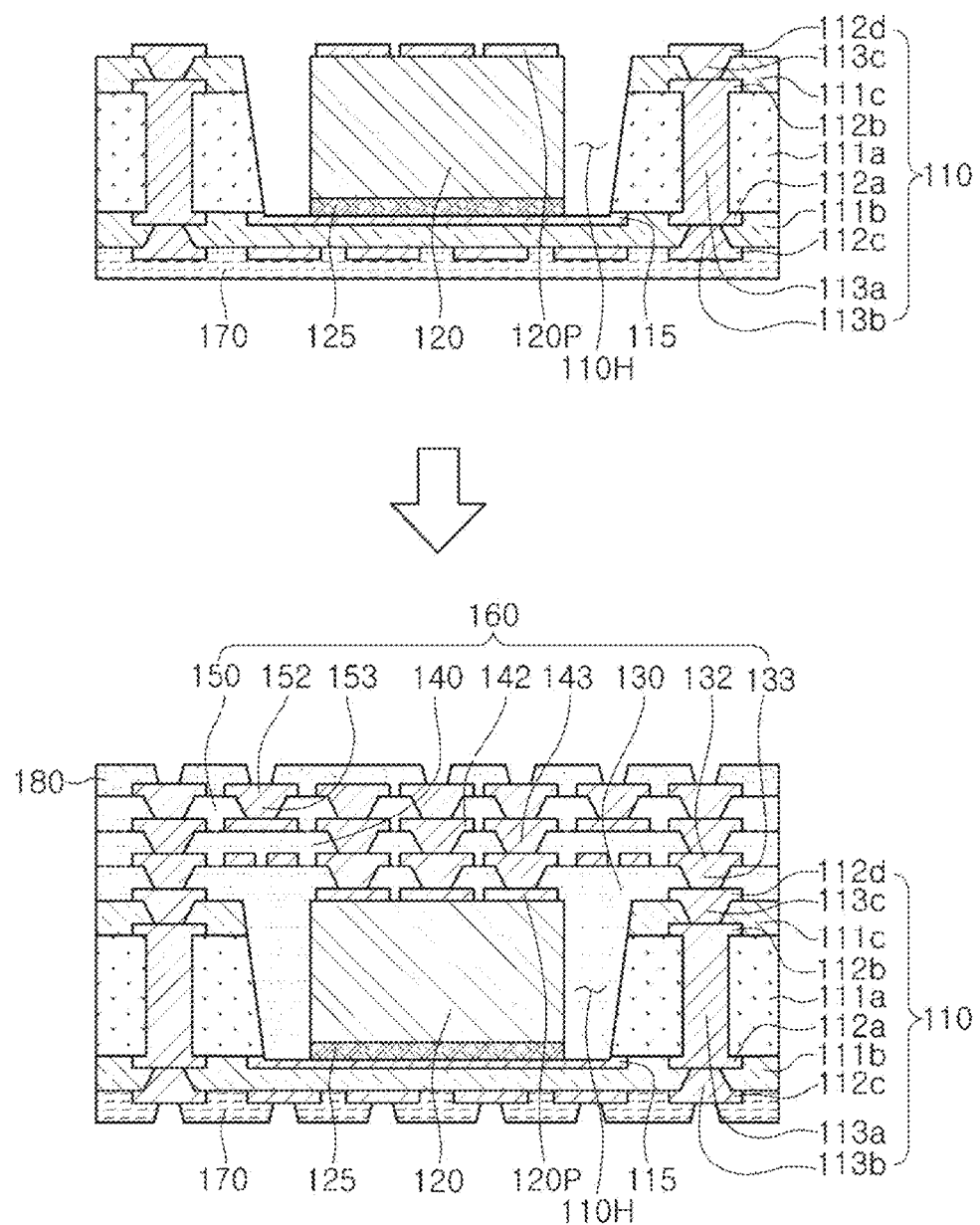

FIGS. 7 and 8 are diagrams illustrating processes of manufacturing the substrate having an electronic component embedded therein illustrated in FIG. 3.

Referring to FIG. 7, a CCL used as a first core insulating layer 111a may be prepared. The CCL may be formed by stacking copper foil on upper and lower surfaces of an insulating material. A via hole for a first core via layer 113a may be formed in the CCL using a mechanical drill, or the like. The first and second core wiring layers 112a and 112b and the first core via layer 113a may be formed through a plating process. The stopper layer 115 may be formed. Prepreg may be laminated on upper and lower sides of the first core insulating layer 111a using an RCC, or the like, thereby forming second and third core insulating layers 111b and 111c. The RCC may be formed by stacking copper foil on an insulating material. A via hole for the second and third core via layers 113b and 113c may be formed using a laser process. Third and fourth core wiring layers 112c and 112d and the second and third core via layers 113b and 113c may be formed through a plating process. If desired, a detach carrier film 310 may be attached to a lower side of a core structure 110 with a first passivation layer 170 such as an ABF interposed therebetween. A patterned dry film may be attached to an upper side of the core structure 110, and the cavity 110H having a depth formed to the stopper layer 115 may be formed by removing the core insulating layers 111a and 111c using a sandblasting process. To form the composite 117 described in the aforementioned example embodiment on the surface of the stopper layer 115, process conditions, and the like, may be controlled.

Referring to FIG. 8, an electronic component 120 may be attached to the stopper layer 115 in the cavity 110H, and the electronic component 120 may be disposed to be faced up. A first built-up insulating layer 130 may be formed by laminating an ABF, or the like. A via hole may be formed through a laser process, and a first built-up wiring layer 132 and a first built-up via layer 133 may be formed through a plating process. A second built-up insulating layer 140, a second built-up wiring layer 142, and a second built-up via layer 143 may be formed by a method similar to the above-described method. A third built-up insulating layer 150, a third built-up wiring layer 152, and a third built-up via layer 153 may also be formed by a method similar to the above-described method. A built-up structure 160 may be formed by the processes described above. If desired, a second passivation layer 180 may be formed by laminating an ABF or coating and curing an SR on an upper side of the built-up structure 160. A first passivation layer 170 may be formed simultaneously in the process for forming the second passivation layer 180, or may be formed in advance in the previous process described above. A detach carrier film may be separated, and if desired, first and second openings may be formed in the first and second passivation layers 170 and 180. Also, if desired, first and second electrical connector metals 190 and 220 may be formed and a surface-mount component 210 may be mounted.

The substrate having an electronic component embedded therein 100 may be manufactured through the above-described processes. The descriptions of the other elements are the same as in the aforementioned example embodiments, and detailed descriptions thereof will thus not be provided.

According to the aforementioned example embodiments, a substrate having an electronic component embedded therein having improved adhesive reliability between different materials may be provided.

Also, a substrate having an electronic component embedded therein which may be modulated in a form of SiP and may have a reduced size may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A substrate having an electronic component embedded therein, the substrate comprising:
   a core structure including a first insulating body and a plurality of core wiring layers disposed on or in the first insulating body, and having a cavity penetrating at least a portion of the first insulating body in a thickness direction of the substrate and including a stopper layer as a bottom surface of the cavity; and
   an electronic component disposed in the cavity and attached to the stopper layer, wherein a surface of the stopper layer facing the electronic component has a composite including at least two among a metal material, an inorganic particle, a filler, and an insulating resin.

2. The substrate of claim 1, wherein a plurality of the composites are disposed on the surface of the stopper layer.

3. The substrate of claim 1, wherein the inorganic particle includes at least one of silicon carbide (SiC) or alumina ($Al_2O_3$).

4. The substrate of claim 1, wherein the metal material is the same as a metal material included in at least a portion of the stopper layer, and a filler and an insulating resin are the same as a filler and an insulating resin included in at least a portion of the first insulating body, respectively.

5. The substrate of claim 1,
wherein the stopper layer has a central region in which a portion of the surface of the stopper layer is exposed from the first insulating body and an edge region in which the other portion of the surface is covered by the first insulating body, and
wherein among the portion of the surface of the stopper layer in the central region and the other portion of the surface of the stopper layer in the edge region, the composite is disposed only on the surface of the stopper layer disposed in the central region.

6. The substrate of claim 5, wherein the surface of the stopper layer disposed in the central region has an embossed surface, an average difference in heights of serrations of the surface of the stopper layer disposed in the central region higher than an average difference in heights of serrations of the surface of the stopper layer disposed in the edge region.

7. The substrate of claim 5, wherein a thickness of the stopper layer disposed in the central region is less than a thickness of the stopper layer disposed in the edge region.

8. The substrate of claim 1, wherein the stopper layer is disposed on a level the same as a level of one of the plurality of core wiring layers.

9. The substrate of claim 1, wherein the electronic component has a first surface on which a connection pad is disposed and a second surface opposing the first surface, and the second surface is attached to the stopper layer through a die attach film.

10. The substrate of claim 1,
wherein the core structure includes:
a first core insulating layer, a first core wiring layer and the stopper layer disposed on one surfaces of the first core insulating layer, respectively, a second core wiring layer disposed on the other surface of the first core insulating layer, a second core insulating layer disposed on one surface of the first core insulating layer and covering at least a portion of each of the first core wiring layer and the stopper layer, a third core insulating layer disposed on the other surface of the first core insulating layer and covering at least a portion of the second core wiring layer, a third core wiring layer disposed on the second core insulating layer, a fourth core wiring layer disposed on the third core insulating layer, a first core via layer penetrating the first core insulating layer and connecting the first and second core wiring layers to each other, a second core via layer penetrating the second core insulating layer and connecting the first and third core wiring layers to each other, and a third core via layer penetrating the third core insulating layer and connecting the second and fourth core wiring layers to each other,
wherein the first insulating body includes the first to third core insulating layers,
wherein the plurality of core wiring layers include the first to fourth core wring layers,
wherein the first core insulating layer has a thickness greater than a thickness of each of the second and third core insulating layers, and
wherein the second and third core via layers have profiles tapered in opposite directions.

11. The substrate of claim 1, further comprising:
a built-up structure including a second insulating body covering at least a portion of each of the core structure and the electronic component and disposed in at least a portion of the cavity, and one or more built-up wiring layers disposed on or in the second insulating body.

12. The substrate of claim 11,
wherein the built-up structure includes a first built-up insulating layer covering at least the portion of each of the core structure and the electronic component and disposed in at least the portion of the cavity, a first built-up wiring layer disposed on the first built-up insulating layer, and a first built-up via layer penetrating the first built-up insulating layer and connecting the first built-up wiring layer to the electronic component and each of the plurality of core wiring layers,
wherein the second insulating body includes the first built-up insulating layer,
wherein the one or more built-up wiring layers includes the first built-up wiring layer, and
wherein the first built-up via layer has a tapered profile in which a width of a cross-sectional surface of the first built-up via layer decreases in a direction towards the core structure.

13. The substrate of claim 12,
wherein the built-up structure further includes a second built-up insulating layer disposed on the first built-up insulating layer and covering at least a portion of the first built-up wiring layer, a second built-up wiring layer disposed on the second built-up insulating layer, and a second built-up via layer penetrating the second built-up insulating layer and connecting the first and second built-up wiring layers to each other,
wherein the second insulating body further includes the second built-up insulating layer,
wherein the one or more built-up wiring layers further include the second built-up wiring layer, and
wherein the second built-up via layer has a tapered profile in which a width of a cross-sectional surface of the second built-up via layer decreases in the direction towards the core structure.

14. The substrate of claim 12, wherein the first built-up insulating layer is in contact with the composite.

15. The substrate of claim 11, further comprising:
a first passivation layer disposed on a side opposing a side of the core structure on which the built-up structure is disposed, and having a plurality of first openings for exposing at least a portion of one of the plurality of core wiring layers;
a plurality of first electrical connector metals disposed on the plurality of first openings, respectively, and connected to at least a portion of the exposed core wiring layers, respectively;
a second passivation layer disposed on a side opposing a side of the built-up structure on which the core structure is disposed, and having a plurality of second openings for exposing at least a portion of one of the one or more built-up wiring layers;
a plurality of second electrical connector metals disposed on the plurality of second openings, respectively, and connected to at least a portion of the exposed built-up wiring layers, respectively; and one or more surface-mount components mounted on the second passivation layer through the plurality of second electrical connector metals.

16. The substrate of claim 1, wherein the composite is spaced apart from the electronic component.

17. A substrate having an electronic component embedded therein, the substrate comprising:
a core structure including a first insulating body and a plurality of core wiring layers disposed on or in the first insulating body, and having a cavity penetrating at least a portion of the first insulating body in a thickness direction of the substrate and including a stopper layer as a bottom surface of the cavity; and
an electronic component disposed in the cavity and attached to the stopper layer,
wherein the stopper layer has a central region in which a portion of a surface of the stopper layer is exposed from the first insulating body and an edge region in which the other portion of the surface is covered by the first insulating body, and
wherein a material of the surface of the stopper layer disposed in the central region is different from a material of the surface of the stopper layer disposed in the edge region.

18. The substrate of claim 17,
wherein the surface of the stopper layer disposed in the central region has a composite including at least two among a metal material, an inorganic particle, a filler, and an insulating resin, and
wherein the surface of the stopper layer disposed in the edge second region has a metal material.

19. A substrate comprising:
a core structure including an insulating body and a plurality of core wiring layers disposed on or in the insulating body, and having a cavity penetrating at least a portion of the insulating body in a thickness direction of the substrate and including a stopper layer as a bottom surface of the cavity;
an electronic component disposed in the cavity and on the stopper layer; and
a built-up insulating layer covering at least a portion of each of the core structure and the electronic component and disposed in at least a portion of the cavity,
wherein a surface of the stopper layer facing the electronic component has a composite comprising one or more of silicon carbide (SiC) and alumina ($Al_2O_3$), and
wherein the built-up insulating layer is in contact with the composite.

20. The substrate of claim 19, wherein the stopper layer comprises copper (Cu), and the composite further comprises copper (Cu).

* * * * *